(12) United States Patent
Morita

(10) Patent No.: US 8,013,077 B2
(45) Date of Patent: Sep. 6, 2011

(54) INSULATING FILM FORMING COMPOSITION AND PRODUCTION METHOD OF INSULATING FILM

(75) Inventor: Kensuke Morita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 627 days.

(21) Appl. No.: 12/040,951

(22) Filed: Mar. 3, 2008

(65) Prior Publication Data

US 2008/0213492 A1   Sep. 4, 2008

(30) Foreign Application Priority Data

Mar. 2, 2007  (JP) .................................. 2007-052630
Mar. 2, 2007  (JP) .................................. 2007-052631

(51) Int. Cl.
    *C08F 283/04*  (2006.01)
(52) U.S. Cl. ......... 525/431; 525/474; 525/477; 525/479
(58) Field of Classification Search .................. 525/431, 525/474, 477, 479; 428/447
    See application file for complete search history.

(56) References Cited

U.S. PATENT DOCUMENTS

| 7,423,107 | B2 * | 9/2008 | Ootake et al. .................. 528/31 |
| 7,553,904 | B2 * | 6/2009 | Lichtenhan et al. .......... 525/101 |
| 2004/0242821 | A1 | 12/2004 | Hatakeyama et al. |
| 2005/0107541 | A1 * | 5/2005 | Bening ......................... 525/242 |
| 2007/0054135 | A1 * | 3/2007 | Morita et al. ................. 428/447 |

FOREIGN PATENT DOCUMENTS

| JP | 2000-334881 A | 12/2000 |
| JP | 2003-012820 A | 1/2003 |
| JP | 2004-303800 A | 10/2004 |
| JP | 2004-352743 A | 12/2004 |
| JP | 2006-022207 A | 1/2006 |
| JP | 2006-045516 A | 2/2006 |
| JP | 2006-156602 A | 6/2006 |
| JP | 2007 092019   | * 4/2007 |
| JP | 2007-164045 A | 6/2007 |

OTHER PUBLICATIONS

Office Action dated Nov. 16, 2010 in corresponding Japanese Application JP 2007-052630.
Office Action dated Nov. 16, 2010 in corresponding Japanese Application JP 2007-052631.
Decision for Rejection dated Mar. 8, 2011 in Japanese Application No. 2007-052631.
Notice of Reasons for Rejection dated Mar. 8, 2011 in Japanese Application 2007-052630.

* cited by examiner

*Primary Examiner* — Margaret G Moore
(74) *Attorney, Agent, or Firm* — Sughrue Mion, PLLC

(57) ABSTRACT

An insulating film forming composition, includes: a polymer compound obtained by polymerizing a cage-type silsesquioxane compound having two or more unsaturated groups as substituents; a heat-resistant organic polymer compound having a carbon-carbon unsaturated bond; and an organic solvent, and a method for producing an insulating film, includes: coating the insulating film forming composition on a substrate; and then curing the coating.

7 Claims, No Drawings

US 8,013,077 B2

INSULATING FILM FORMING COMPOSITION AND PRODUCTION METHOD OF INSULATING FILM

BACKGROUND OF THE INVENTION

1. Field of the Invention

The present invention relates to an insulating film forming composition and a production method of an insulating film. More specifically, the present invention relates to an insulating film forming composition for use as an interlayer insulating film material in a semi-conductor device or the like, which can form a film coating having an appropriate uniform thickness and moreover is useful for the formation of an insulating film excellent in dielectric characteristics and the like, and a production method of an insulating film.

2. Description of the Related Art

Conventionally, a silica ($SiO_2$) film formed by a vacuum process such as vapor growth (CVD) method is often used as an interlayer insulating film in a semiconductor device or the like. In recent years, a coating-type insulating film mainly comprising a hydrolysate of tetraalkoxysilane, called SOG (spin-on-glass) film, comes to be used for the purpose of forming a more uniform interlayer insulating film. Also, with an increase in the integration of a semiconductor device and the like, a low-dielectric-constant interlayer insulating film mainly comprising a polyorganosiloxane, called organic SOG, is being developed.

However, the dielectric constant is about 4 even in the case of a CVD-$SiO_2$ film exhibiting a lowest dielectric constant out of inorganic material films. The relative dielectric constant of an SiOF film which is being recently studied as a low-dielectric-constant CVD film is from about 3.3 to 3.5, but this film is highly hygroscopic and has a problem that the dielectric constant rises in the course of usage.

Under these circumstances, as regards the insulating film material excellent in the insulting property, heat resistance and durability, there is known a method of adding a high boiling point solvent or a thermally decomposable compound to organopolysiloxane to form pores, thereby decreasing the dielectric constant. However, even if the dielectric characteristics are decreased by forming pores, the porous film is disadvantageous, for example, in that the mechanical strength deteriorates and an increase of the dielectric constant occurs due to moisture absorption. Also, formation of pores connected with each other brings about a problem, for example, that copper used for wiring diffuses into the insulating film.

On the other hand, there is also known an attempt to obtain a film having a low refractive index and a low density by coating a solution where a low molecular cage-type compound is added to an organic polymer (see, JP-A-2000-334881 (the term "JP-A" as used herein means an "unexamined published Japanese patent application")). However, in this method, the effect of decreasing the refractive index and dielectric constant is insufficient.

SUMMARY OF THE INVENTION

Accordingly, the present invention relates to an insulating film forming composition and a production method of an insulating film, for solving the above-described problems (the term "insulating film" is also referred to as "dielectric film" and "dielectric insulating film", but these terms are not substantially distinguished). That is, an object of the present invention is to provide an insulating film forming composition and a production method of an insulating film, ensuring that a film having an appropriate uniform thickness and being suitable for use as an interlayer insulating film in a semiconductor device or the like can be formed and moreover, the film is excellent in the film characteristics such as dielectric constant and Young's modulus.

It has been found that this object of the present invention can be attained by the following means.

(1) An insulating film forming composition, comprising:
a polymer compound obtained by polymerizing a cage-type silsesquioxane compound having two or more unsaturated groups as substituents;
a heat-resistant organic polymer compound having a carbon-carbon unsaturated bond; and
an organic solvent.

(2) The insulating film forming composition as described in (1) above,
wherein the heat-resistant organic polymer compound is an organosiloxane, a polyimide, a polybenzoxazole, a polyarylene or a polyacetylene.

(3) The insulating film forming composition as described in (1) or (2) above,
wherein the cage-type silsesquioxane compound is a compound having m units of $RSi(O_{0.5})_3$,
wherein m represents an integer of 8 to 16;
each R independently represents a non-hydrolyzable group; and
at least two R's are a group containing a carbon-carbon unsaturated bond, and
wherein each unit is connected with another unit to form a cage structure while sharing an oxygen atom in each unit.

(4) The insulating film forming composition as described in (3) above,
wherein m represents an integer of 8, 10 or 12.

(5) An insulating film forming composition, comprising:
a copolymer of (I) a cage-type silsesquioxane compound having two or more unsaturated groups as substituents and (II) a compound having a group containing a carbon-carbon unsaturated bond; and
an organic solvent.

(6) The insulating film forming composition as described in (5) above,
wherein the cage-type silsesquioxane compound is a compound having m units of $RSi(O_{0.5})_3$,
wherein m represents an integer of 8 to 16;
each R independently represents a non-hydrolyzable group; and
at least two R's are a group containing a carbon-carbon unsaturated bond, and
wherein each unit is connected with another unit to form a cage structure while sharing an oxygen atom in each unit.

(7) The insulating film forming composition as described in (6) above,
wherein m represents an integer of 8, 10 or 12.

(8) The insulating film forming composition as described in any of (5) to (7) above,
wherein the compound (II) having a group containing a carbon-carbon unsaturated bond is a compound represented by any of formulae (D-I) to (D-IV):

$$R_4Si \tag{D-I}$$

wherein each R independently represents a non-hydrolyzable group; and at least two R's are a group containing a carbon-carbon unsaturated bond, $$R_3Si-(X-SiR_2)_m-X-Si-R_3 \tag{D-II}$$

wherein each R independently represents a non-hydrolyzable group; at least two R's are a group containing a carbon-carbon unsaturated bond; m is an integer of 0 or more; X represents —O—, —NR¹—, an alkylene group or a phenylene group; and R¹ is a hydrogen atom or a substituent,

*—(X—SiR₂)ₙ—* (D-III)

wherein each R independently represents a non-hydrolyzable group; at least two R's are a group containing a carbon-carbon unsaturated bond; X represents —O—, —NR¹—, an alkylene group or a phenylene group; R¹ is a hydrogen atom or a substituent; n is an integer of 2 to 16; and *'s are combined to form a ring, and

E-(R)ₘ (D-IV)

wherein E represents a benzene ring, an adamantane skeleton or a diadamantane skeleton; each R independently represents a group containing a carbon-carbon unsaturated group; m is an integer of 2 to 10; and the benzene ring, the adamantane skeleton or the diadamantane skeleton may have a substituent.

(9) The insulating film forming composition as described in (8) above, wherein the group containing a carbon-carbon unsaturated bond in formulae (D-I) to (D-IV) is a group containing an ethynyl group or a vinyl group.

(10) The insulating film forming composition as described in (9) above, wherein the group containing a carbon-carbon unsaturated bond in formulae (D-I) to (D-IV) is a group containing an ethynyl group.

(11) A method for producing an insulating film, comprising:

coating the insulating film forming composition as described in any of (1) to (10) above on a substrate; and then curing the coating.

DETAILED DESCRIPTION OF THE INVENTION

The insulating film forming composition (hereinafter, sometimes referred to as a "composition") of the present invention contains a polymer compound obtained by polymerizing a cage-type silsesquioxane compound having two or more unsaturated groups as substituents.

Examples of the cage-type silsesquioxane compound having two or more unsaturated groups as substituents (hereinafter sometimes referred to as a compound (I)) include a compound having m units of $RSi(O_{0.5})_3$ (wherein m represents an integer of 8 to 16, each R independently represents a non-hydrolyzable group, and at least two R's are a group containing a carbon-carbon unsaturated bond), where each unit is connected with another unit to form a cage structure while sharing an oxygen atom in each unit (hereinafter, sometimes referred to as a compound (I')).

In the compound (I'), m is preferably 8, 10, 12, 14 or 16 in view of the effect of decreasing the dielectric constant, more preferably 8, 10 or 12 in view of availability.

The term "cage structure" as used herein means a molecule where the capacity is defined by a plurality of rings formed of covalently bonded atoms and a point located inside the capacity cannot leave the capacity without passing through the ring.

Examples of the cage structure represented by the compound (I) are set forth below. In the following, the free bond indicates the position to which R is bonded.

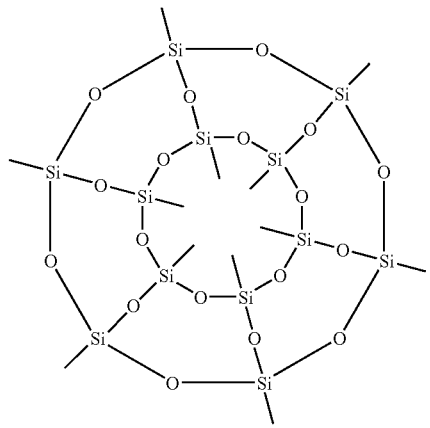

(Q-1)

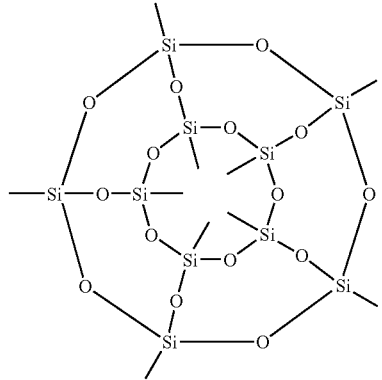

(Q-2)

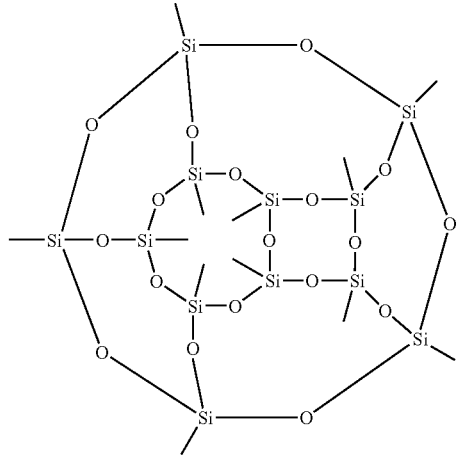

(Q-3)

(Q-4)

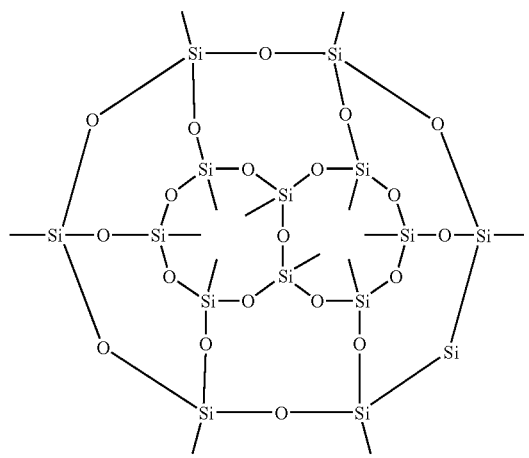

(Q-7)

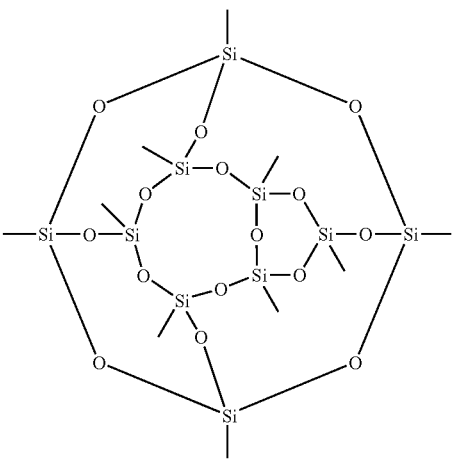

(Q-5)

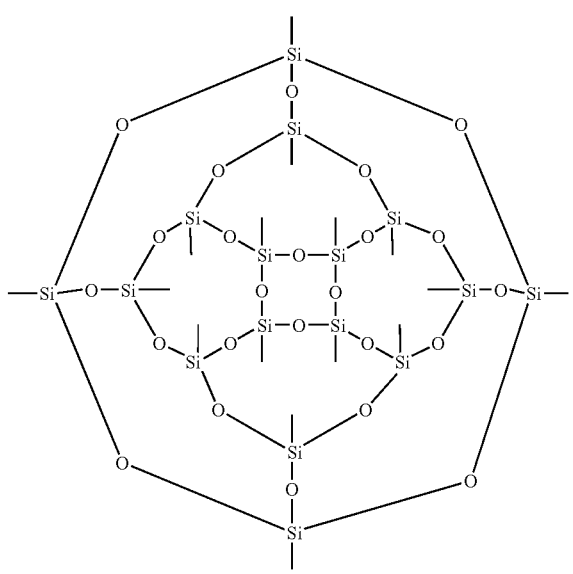

(Q-6)

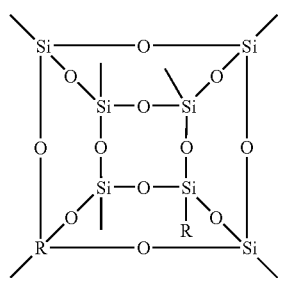

In Compound (I), each R independently represents a non-hydrolyzable group.

Here, the non-hydrolyzable group is a group which remains at a rate of 95% or more when contacted with one equivalent of neutral water for 1 hour at room temperature. The group preferably remains at a rate of 99% or more under these conditions.

At least two R's are a group containing a carbon-carbon unsaturated bond. Examples of the non-hydrolyzable group of R include an alkyl group (e.g., methyl, tert-butyl, cyclopentyl, cyclohexyl), an aryl group (e.g., phenyl, 1-naphthyl, 2-naphthyl), a vinyl group, an ethynyl group, an allyl group, and a silyloxy group (e.g., trimethylsilyloxy, triethylsilyloxy, tert-butyldimethylsilyloxy).

Out of the groups represented by R, at least two groups are preferably a group containing a vinyl group or an ethynyl group, and it is more preferred that at least two groups are a group containing a vinyl group. When the group represented by R contains a vinyl group or an ethynyl group, the vinyl group or ethynyl group is preferably bonded to the silicon atom to which R is bonded, directly or through a divalent linking group. The divalent linking group includes —[C($R^{11}$)($R^{12}$)]$_k$—, —CO—, —O—, —N($R^{13}$)—, —S—, —O—Si($R^{14}$)($R^{15}$)—, and a divalent linking group composed of an arbitrary combination thereof (wherein $R^{11}$ to $R^{15}$ each independently represents a hydrogen atom, a methyl group, an ethyl group or a phenyl group, and k represents an integer of 1 to 6). Among these, —[C($R^{11}$)($R^{12}$)]$_k$—, —O—, —O—Si($R^{14}$)($R^{15}$)—, and a divalent linking group composed of an arbitrary combination thereof are preferred.

In the compound (I), the vinyl group or ethynyl group is preferably bonded directly to the silicon atom to which R is bonded.

A compound where at least two vinyl groups out of R's in the compound (I) are bonded directly to the silicon atom to which R is bonded is more preferred, a compound where at least half of R's in the compound (I) all are a vinyl group is still more preferred, and a compound where R's all are a vinyl group is yet still more preferred.

Specific examples of the compound (I) include, but are not limited to, the followings.

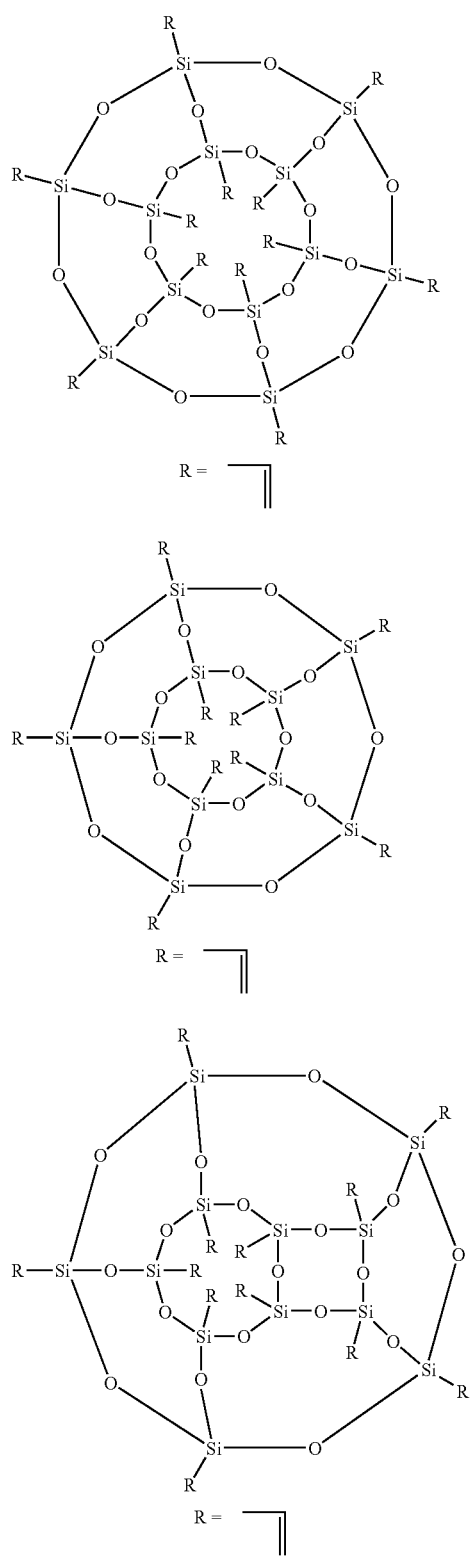
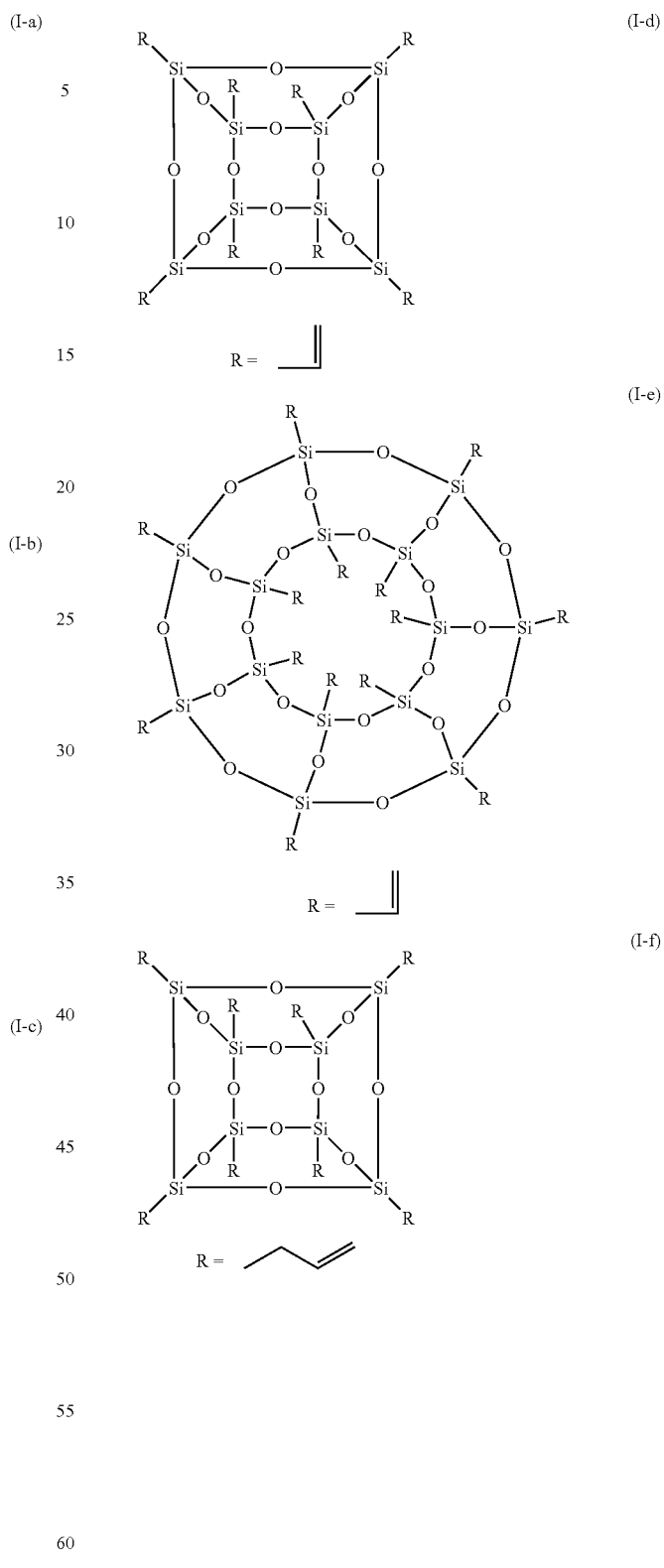

(I-g)

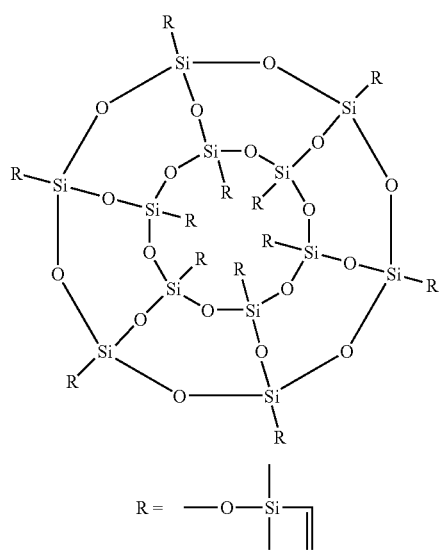

(I-h)

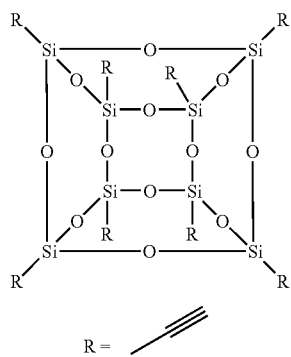

(I-i)

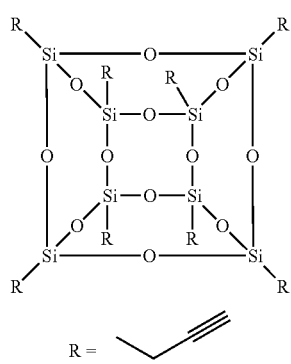

(I-j)

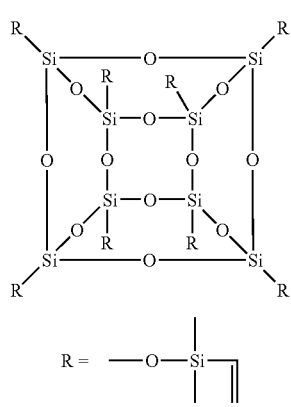

(I-k)

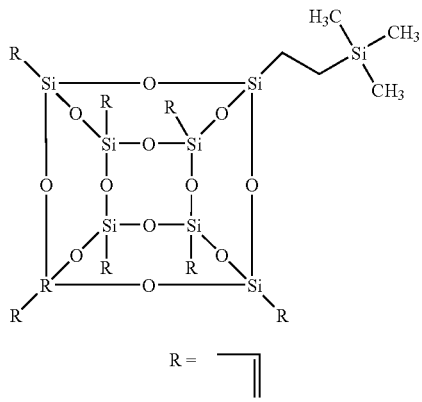

(I-l)

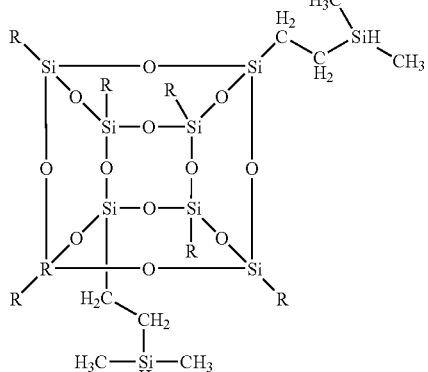

R = 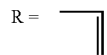

As for the compound (I), a commercially available compound may be used, or the compound may be synthesized by a known method.

A compound where R in the compound (I) of the present invention is a group represented by the following formula (A) is also preferred, and in this case, the compound can be synthesized by reacting a compound represented by the following formula (B) and a compound represented by the following formula (C).

$$(R^1)_3\text{—Si—O—} \quad (A)$$

$$[MO\text{—}Si(O_{0.5})_3]_m \quad (B)$$

$$(R^1)_3\text{—Si—Cl} \quad (C)$$

The compound represented by formula (B) can be synthesized, for example, according to the method described in Angew. Chem. Int. Ed. Engl., 36, No. 7, 743-745 (1997).

In the formulae above, each $R^1$ independently represents a non-hydrolyzable group. Specific examples of the non-hydrolyzable group represented by $R^1$ include an alkyl group, an aryl group, a vinyl group and an ethynyl group. m has the same meanings as those in the compound (I').

M represents a metal atom (e.g., Na, K, Cu, Ni, Mn) or an onium cation (e.g., tetramethylammonium). Here, when M is a polyvalent metal atom, this means that a plurality of —O—Si(O$_{0.5}$)$_3$ are bonded to the polyvalent metal atom M.

The reaction between a compound represented by the formula (B) and a compound represented by formula (C) is performed, for example, by adding a compound represented by formula (B) and a compound represented by formula (C) in an amount of 1 to 100 molar times the number of Si—OM groups contained in the compound represented by formula (B), and allowing the reaction to proceed while stirring usually at 0 to 180° C. for 10 minutes to 20 hours.

The solvent is preferably an organic solvent such as toluene, hexane and tetrahydrofuran (THF).

At the reaction of a compound represented by formula (B) and a compound represented by formula (C), a base such as triethylamine and pyridine may be also added.

In the composition of the present invention, a polymerization product of a plurality of different compounds (I) may be contained. The polymerization product may be a copolymer comprising a plurality of different compounds (I) or may comprise a mixture of homopolymers. In the case where the composition of the present invention contains a copolymer comprising a plurality of different compounds (I), the copolymer is preferably a copolymer of a mixture of two or more kinds of compounds (I') selected from those where m=8, 10 and 12.

The polymer compound obtained by polymerizing the compound (I), contained in the composition of the present invention, may be a copolymerization product with a compound other than the compound (I). The compound used here is preferably a compound having a plurality of polymerizable carbon-carbon unsaturated bonds or SiH groups. Preferred examples of the compound include vinylsilanes, vinylsiloxanes, phenylacetylenes and $[(HSiO_{0.5})_3]_8$.

The composition of the present invention may be a solution obtained by dissolving a reactant (polymerization product) of the compound (I) in an organic solvent or may be a solid matter containing a reactant of the compound (I).

The composition of the present invention is also preferably an insulating film forming composition comprising a copolymer of (I) a cage-type silsesquioxane compound having two or more unsaturated groups as substituents and (II) a compound having a group containing a carbon-carbon unsaturated bond, and an organic solvent.

The compound (II) includes compounds represented by formulae (D-I) to (D-IV):

$R_4Si$ (D-I)

(wherein each R independently represents a non-hydrolyzable group, and at least two R's are a group containing a carbon-carbon unsaturated bond);

$R_3Si—(X—SiR_2)M-X—Si—R_3$ (D-II)

(wherein each R independently represents a non-hydrolyzable group, at least two R's are a group containing a carbon-carbon unsaturated bond, m is an integer of 0 or more, X represents —O—, —NR$^1$—, an alkylene group or a phenylene group, and R$^1$ is a hydrogen atom or a substituent);

*—(X—SiR$_2$)$_n$—* (D-III)

(wherein each R independently represents a non-hydrolyzable group, at least two R's are a group containing a carbon-carbon unsaturated bond, X represents —O—, —NR$^1$—, an alkylene group or a phenylene group, R$^1$ is a hydrogen atom or a substituent, n is an integer of 2 to 16, and *'s are combined to form a ring); and E-(R)$_m$ (D-IV)

(wherein E represents a benzene ring, an adamantane skeleton or a diadamantane skeleton, each R independently represents a group containing a carbon-carbon unsaturated group, m is an integer of 2 to 10, and the benzene ring, adamantane skeleton or diadamantane skeleton may have other substituents).

The group containing a carbon-carbon unsaturated bond in formulae (D-I) to (D-IV) is preferably a group containing an ethynyl group or a vinyl group. In formula (D-IV), the group containing a carbon-carbon unsaturated bond is more preferably a group containing an ethynyl group.

Specific examples of the compound (II) include, but are not limited to, the followings.

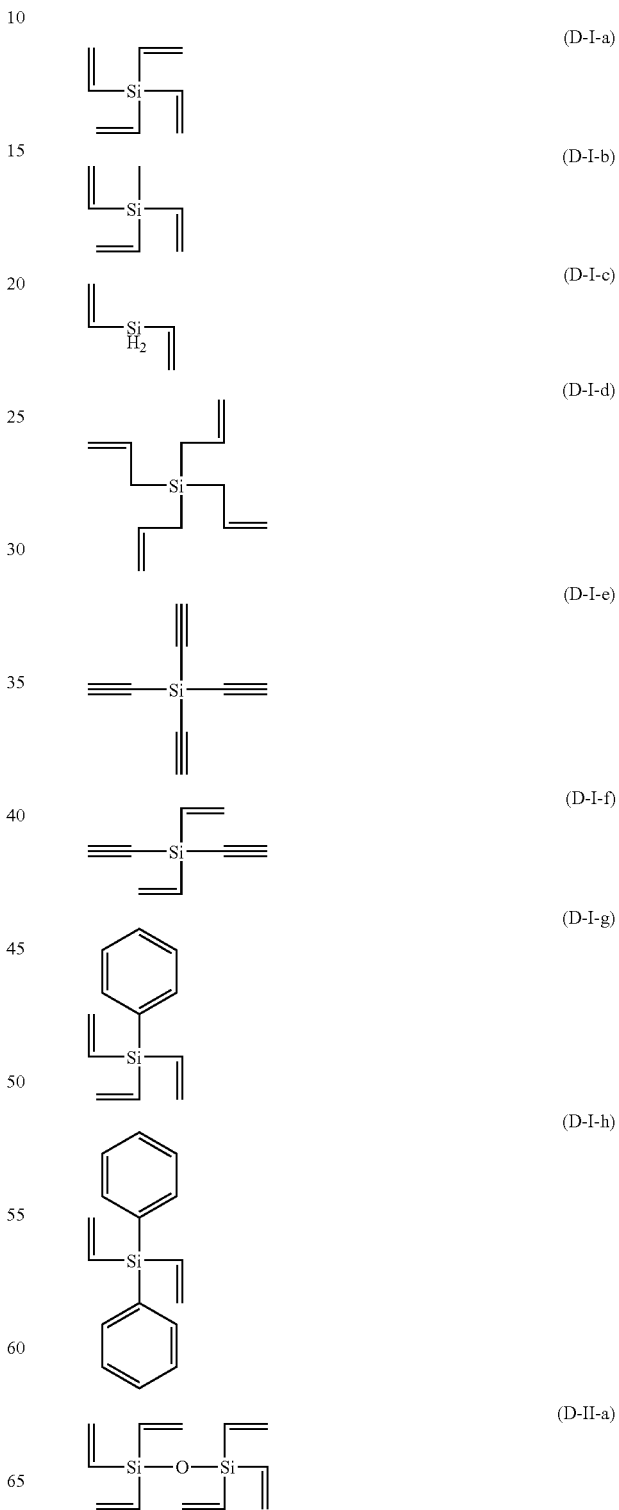

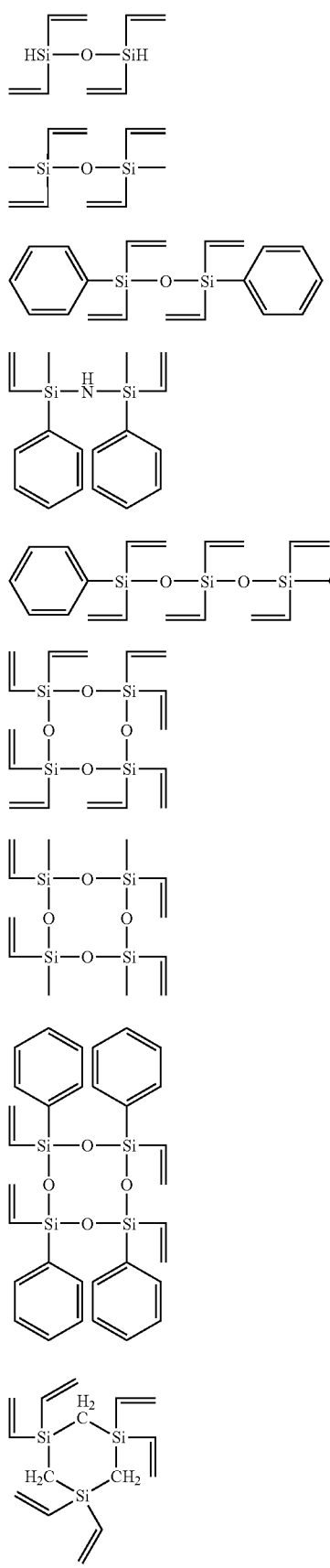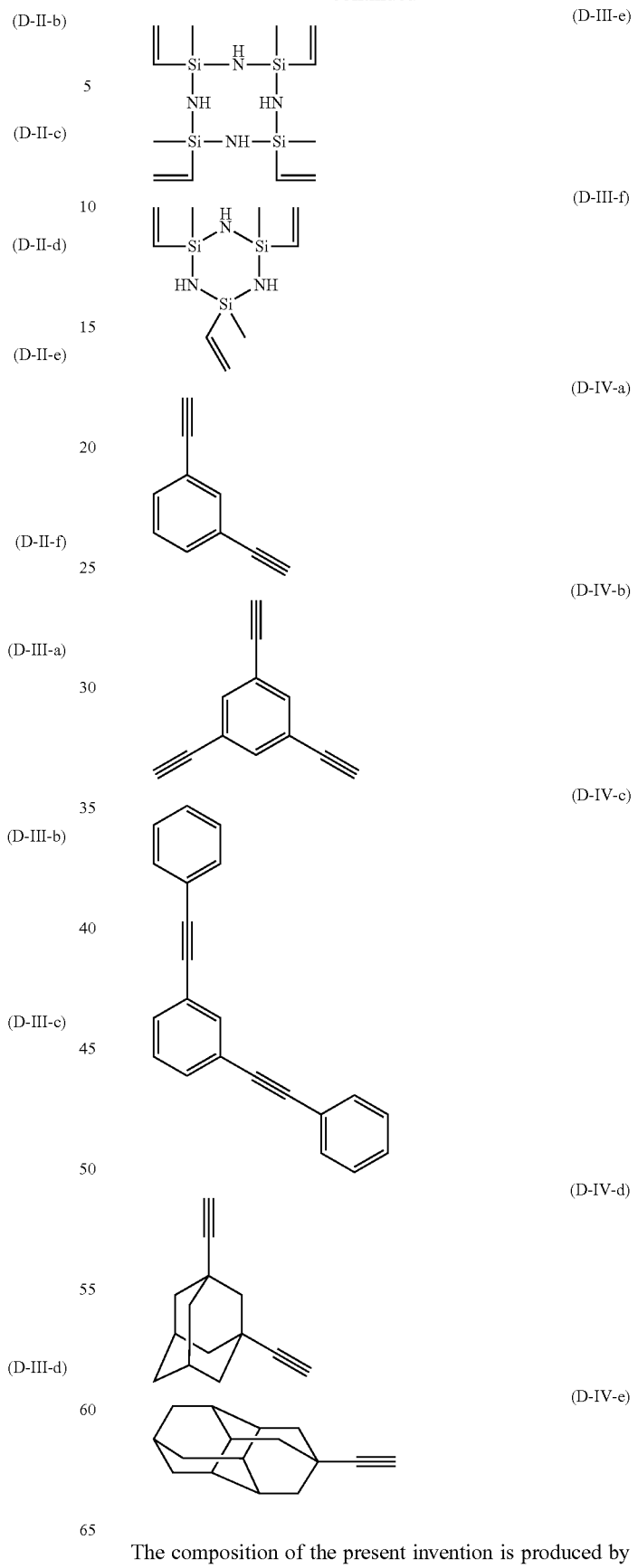
The composition of the present invention is produced by dissolving the compound (I), or the compound (I) and the compound (II), in a solvent, adding a polymerization initiator, and reacting the carbon-carbon unsaturated bond.

The polymerization reaction may be any polymerization reaction, but examples thereof include radical polymerization, cationic polymerization, anionic polymerization, ring-opening polymerization, polycondensation, polyaddition, addition condensation, and transition metal-catalyzed polymerization.

The polymerization reaction of the compound (I), or the compound (I) and the compound (II), is preferably performed in the presence of a nonmetallic polymerization initiator. For example, the polymerization may be performed in the presence of a polymerization initiator which generates a free radical such as carbon radical or oxygen radical under heating and thereby exhibits the activity.

In particular, the polymerization initiator used is preferably an organic peroxide or an organic azo-based compound.

Preferred Examples of the organic peroxide include ketone peroxides such as PERHEXA H, peroxy ketals such as PERHEXA TMH, hydroperoxides such as PERBUTYL H-69, dialkyl peroxides such as PERCUMYL D, PERBUTYL C and PERBUTYL D, diacyl peroxides such as NYPER BW, peroxy esters such as PERBUTYL Z and PERBUTYL L, and peroxydicarbonate such as PEROYL TCP, commercially available from Nippon Oils and Fats Co.; also include diisobutyryl peroxide, cumyl peroxyneodecanoate, di-n-propyl peroxydicarbonate, diisopropyl peroxydicarbonate, di-sec-butyl peroxydicarbonate, 1,1,3,3-tetramethylbutyl peroxyneodecanoate, di(4-tertbutylcyclohexyl) peroxydicarbonate, di(2-ethylhexyl)peroxydicarbonate, tert-hexyl peroxyneodecanoate, tert-butyl peroxyneodecanoate, tert-butyl peroxyneoheptanoate, tert-hexyl peroxypivalate, tert-butyl peroxypivalate, di(3,5,5-trimethylhexanoyl)peroxide, dilauroyl peroxide, 1,1,3,3-tetramethylbutyl peroxy-2-ethylhexanoate, disuccinic acid peroxide, 2,5-dimethyl-2,5-di(2-ethylhexanoylperoxy)hexane, tert-hexylperoxy-2-ethyl hexanoate, di(4-methylbenzoyl)peroxide, tert-butyl peroxy-2-ethylhexanoate, di(3-methylbenzoyl) peroxide, benzoyl(3-methylbenzoyl)peroxide, dibenzoyl peroxide, 1,1-di(tert-butylperoxy)-2-methylcyclohexane, 1,1-di(tert-hexylperoxy)-3,3,5-trimethylcyclohexane, 1,1-di(tert-hexylperoxy)-cyclohexane, 1,1-di(tert-butylperoxy)cyclohexane, 2,2-di(4,4-di(tert-butylperoxy)cyclohexyl)propane, tert-hexyl peroxyisopropylmonocarbonate, tert-butyl peroxymaleate, tert-butyl peroxy-3,5,5-trimethylhexanoate, tert-butyl peroxylaurate, tert-butyl peroxyisopropylmonocarbonate, tert-butyl peroxy-2-ethylhexylmonocarbonate, tert-hexyl peroxybenzoate, 2,5-dimethyl-2,5-di(benzoylperoxy)hexane, tert-butyl peroxyacetate, 2,2-di(tert-butylperoxy)butane, tert-butyl peroxybenzoate, n-butyl-4,4-di-tert-butyl peroxyvalerate, di(2-tert-butylperoxyisopropyl)benzene, dicumyl peroxide, di-tert-hexyl peroxide, 2,5-dimethyl-2,5-di(tert-butylperoxy)hexane, tert-butylcumyl peroxide, di-tert-butyl peroxide, p-methane hydroperoxide, 2,5-dimethyl-2,5-di(tert-butylperoxy)hexine-3, diisopropylbenzene hydroperoxide, 1,1,3,3-tetramethylbutyl hydroperoxide, cumene hydroperoxide, tert-butyl hydroperoxide, 2,3-dimethyl-2,3-diphenylbutane, 2,4-dichlorobenzoyl peroxide, o-chlorobenzoyl peroxide, p-chlorobenzoyl peroxide, tris(tert-butylperoxy)triazine, 2,4,4-trimethylpentyl peroxyneodecanoate, α-cumyl peroxyneodecanoate, tert-amyl peroxy-2-ethylhexanoate, tert-butyl peroxyisobutyrate, di-tert-butyl peroxyhexahydroterephthalate, di-tert-butyl peroxytrimethyladipate, di-3-methoxybutyl peroxydicarbonate, diisopropyl peroxydicarbonate, tert-butyl peroxyisopropylcarbonate, 1,6-bis(tert-butylperoxycarbonyloxy)hexane, diethylene glycol bis(tert-butylperoxycarbonate), tert-hexyl peroxyneodecanoate, and Luperox 11 commercially available from ARKEMA Yoshitomi, Ltd.

Preferred examples of the organic azo-based compound include azonitrile compounds such as V-30, V-40, V-59, V-60, V-65 and V-70, azoamide compounds such as VA-080, VA-085, VA-086, VF-096, VAm-110 and VAm-111, cyclic azoamidine compounds such as VA-044 and VA-061, azoamidine compounds such as V-50 and VA-057, and azoester compounds such as V-601, commercially available from Wako Pure Chemical Industries, Ltd.; and also include 2,2-azobis(4-methoxy-2,4-dimethylvaleronitrile), 2,2-azobis(2,4-dimethylvaleronitrile), 2,2-azobis(2-methylpropionitrile), 2,2-azobis(2,4-dimethylbutyronitrile), 1,1-azobis(cyclohexane-1-carbonitrile), 1-[(1-cyano-1-methylethyl)azo]formamide, 2,2-azobis{2-methyl-N-[1,1-bis(hydroxymethyl)-2-hydroxyethyl]propionamide}, 2,2-azobis[2-methyl-N-(2-hydroxybutyl)propionamide], 2,2-azobis[N-(2-propenyl)-2-methylpropionamide], 2,2-azobis(N-butyl-2-methylpropionamide), 2,2-azobis(N-cyclohexyl-2-methylpropionamide), 2,2-azobis[2-(2-imidazolin-2-yl)propane]dihydrochloride, 2,2-azobis[2-(2-imidazolin-2-yl)propane]disulfate dihydrate, 2,2-azobis{2-[1-(2-hydroxyethyl)-2-imidazolin-2-yl]propane}dihydrochloride, 2,2-azobis[2-(2-imidazolin-2-yl)propane], 2,2-azobis(1-imino-1-pyrrolidino-2-methylpropane)dihydrochloride, 2,2-azobis(2-methylpropionamidine)dihydrochloride, 2,2-azobis[N-(2-carboxyethyl)-2-methylpropionamidine] tetrahydrate, dimethyl 2,2-azobis(2-methylpropionate), 4,4-azobis(4-cyanovaleric acid), and 2,2-azobis(2,4,4-trimethylpentane).

Among these polymerization initiators, alkyl peroxy esters, dialkyl peroxides, azonitrile compounds and azoester compounds are preferred.

Only one kind of the polymerization initiator for use in the present invention may be used, or two or more kinds may be mixed and used.

The polymerization initiator for use in the present invention is preferably used in an amount of 0.001 to 2 mol, more preferably from 0.05 to 1 mol, still more preferably from 0.01 to 0.5 mol, per mol of the monomer.

Examples of the method for adding the polymerization initiator for use in the present invention include batch addition, addition in parts and continuous addition, but addition in parts and continuous addition are preferred because a high molecular weight can be obtained by the addition of the polymerization initiator in a small amount, and these are advantageous also in view of the film strength.

The solvent used in the polymerization reaction may be any solvent as long as it can dissolve the compound (I), or the compound (I) and the compound (II), to a necessary concentration and does not adversely affect the properties of the film formed from the obtained polymerization product. In the following, for example, an ester-based solvent indicates a solvent having an ester group within the molecule.

Examples the solvent which can be used include water; an alcohol-based solvent such as methanol, ethanol and propanol; a ketone-based solvent such as acetone, methyl ethyl ketone, methyl isobutyl ketone, cyclohexanone and acetophenone; an ester-based solvent such as methyl acetate, ethyl acetate, propyl acetate, isopropyl acetate, butyl acetate, pentyl acetate, hexyl acetate, methyl propionate, ethyl propionate, propylene glycol monomethyl ether acetate, γ-butyrolactone, and methyl benzoate; an ether-based solvent such as dibutyl ether, anisole and tetrahydrofuran; an aromatic hydrocarbon-based solvent such as toluene, xylene, mesitylene, 1,2,4,5-tetramethylbenzene, pentamethylbenzene, isopropylbenzene, 1,4-diisopropylbenzene, tert-butylbenzene, 1,4-di-tert-butylbenzene, 1,3,5-triethylbenzene, 1,3,5-tri-tert-butylbenzene, 4-tert-butyl-o-xylene, 1-methylnaphthalene and 1,3,5-triisopropylbenzene; an amide-based solvent such as N-methylpyrrolidinone and dimethylacetamide; a halogen-based solvent such as carbon tetrachloride, dichloromethane, chloroform, 1,2-dichloroethane, chlorobenzene, 1,2-dichlorobenzene, and 1,2,4-trichlorobenzene; and an aliphatic hydrocarbon-based solvent such as hexane, heptane, octane and cyclohexane. Among these, an ester-based solvent is preferred, methyl acetate, ethyl acetate, propyl acetate, isopropyl acetate, butyl acetate, pentyl acetate, hexyl acetate, methyl propionate, ethyl propionate, propylene glycol monomethyl ether acetate, γ-butyrolactone and methyl benzoate are more preferred, and ethyl acetate and butyl acetate are still more preferred.

One of these solvents may be used alone, or two or more kinds thereof may be mixed and used.

If the concentration of the compound (I), or the compound (I) and the compound (II), at the polymerization is high, the reaction solution is gelled and a soluble polymer cannot be obtained. Therefore, the concentration of the compound (I) at the polymerization needs to be 15 mass % or less. (In this specification, mass ratio is equal to weight ratio.) When the same solvent is used, as the concentration is lower, a composition having a larger number average molecular weight and being soluble in an organic solvent can be easily synthesized. In this respect, the concentration of the compound (I), or the compound (I) and the compound (II), in the reaction solution is preferably 11 mass % or less, more preferably 8 mass % or less, still more preferably 5 mass % or less.

In view of the productivity at the reaction, a higher concentration of the compound (I), or the compound (I) and the compound (II), at the polymerization is advantageous. In this respect, the concentration of the compound (I), or the compound (I) and the compound (II), at the polymerization is preferably 0.1 mass % or more, more preferably 1 mass % or more.

The optimal conditions of the polymerization reaction in the present invention vary, for example, depending on the kind of polymerization initiator, monomer or solvent, or the concentration, but the internal temperature is preferably from 0 to 200° C., more preferably from 40 to 170° C., still more preferably from 70 to 150° C., and the reaction time is preferably from 1 to 50 hours, more preferably from 2 to 20 hours, still more preferably from 3 to 10 hours.

Also, in order to suppress the deactivation of the polymerization initiator by oxygen, the reaction is preferably performed in an inert gas atmosphere (e.g., nitrogen, argon). The oxygen concentration at the reaction is preferably 100 ppm or less, more preferably 50 ppm or less, still more preferably 20 ppm or less.

The weight average molecular weight (Mw) of the polymer at the completion of polymerization reaction is preferably from 50,000 to 500,000, more preferably 60,000 to 400,000, still more preferably from 70,000 to 300,000.

The ratio between the compound (I) and the compound (II) charged at the polymerization is preferably, in terms of the weight ratio, from 10:90 to 99:1, more preferably from 30:70 to 95:5, and most preferably from 50:50 to 90:10.

The remaining compound (I) and compound (II) can be quantitatively determined, for example, from a GPC chart, an HPLC chart, an NMR spectrum, a UV spectrum and an IR spectrum of the solid material. With respect to the copolymerization product other than the compound (I) as well as the adduct contained in the polymerization product, the content may be sometimes judged from the charging ratio, but these can also be quantitatively determined by purifying the polymerization product, if desired, and then performing the measurement such as NMR spectrum, UV spectrum, IR spectrum and elementary analysis.

In the polymerization product of the present invention, the reactant of the compound (I) preferably accounts for 60 mass % or more, more preferably 80 mass % or more, still more preferably 90 mass % or more, and most preferably 95 mass % or more.

As its content in the polymerization product is larger, a film having a lower dielectric constant can be formed.

The polymerization product of the present invention is preferably soluble in an organic solvent. The term "soluble in an organic solvent" as used herein is defined as being dissolved to a concentration of 5 mass % or more at 25° C. in a solvent selected from cyclohexane, methyl ethyl ketone, methyl isobutyl ketone, propylene glycol monomethyl ether acetate, propylene glycol monomethyl ether and γ-butyrolactone. The polymerization product is preferably dissolved to a concentration of 10 mass % or more, more preferably 20 mass % or more.

The Mw of the polymerization product of the compound (I), or the compound (I) and the compound (II), for use in the present invention is preferably from 50,000 to 500,000, more preferably from 60,000 to 400,000, and most preferably from 70,000 to 300,000.

The Mn of the polymerization product of the compound (I), or the compound (I) and the compound (II), for use in the present invention is preferably from 15,000 to 200,000, more preferably from 20,000 to 150,000, and most preferably from 25,000 to 120,000.

In the present invention, the polystyrene-reduced value by GPC is a value determined using Waters 2695 and Shodex GPC column KF-805L, by passing tetrahydrofuran as an elution solvent at a column temperature of 40° C. and a flow rate of 1 ml/min, injecting 50 μl of a tetrahydrofuran solution having a sample concentration of 0.5 mass %, preparing a calibration curve for the monomer from the integrated value of an RI detecting apparatus (Waters 2414), quantitatively determining the monomer in the solid material, and calculating Mn and Mw with use of the calibration curve prepared using standard polystyrene.

As these average molecular weights are larger, a film having a lower dielectric constant can be formed, but if these average molecular weights are large, insoluble matters in an organic solvent are readily produced. When the average molecular weights are in the ranges above, both a low dielectric constant and solubility or filterability with an organic solvent can be satisfied.

The polymerization product of the present invention preferably contains substantially no component having a molecular weight of 3,000,000 or more, more preferably contains substantially no component having a molecular weight of 2,000,000 or more, and most preferably does not contain a component having a molecular weight of 1,000,000 or more.

The dispersity (Mw/Mn) of the polymerization product of the present invention as calculated from a GPC chart is preferably from 1 to 15, more preferably from 1 to 10, and most preferably from 1 to 5. When Mw is the same, as the dispersity is smaller, a film having a lower dielectric constant can be formed.

The amount of the unreacted compound (I) contained in the composition of the present invention is preferably 40 mass % or less, more preferably 20 mass % or less, still more preferably 10 mass % or less, yet still more preferably 5 mass % or less, and most preferably 2 mass % or less.

In the polymerization product of the present invention, the vinyl group or ethynyl group of the compound (I) preferably remains unreacted at a rate of 10 to 99 mol %, more preferably from 20 to 90 mol %, and most preferably from 30 to 80 mol %.

In the composition of the present invention, the polymerization initiator, additive or polymerization solvent may be bonded in an amount of 0.1 to 40 mass % but is preferably bonded in an amount of 0.1 to 20 mass %, more preferably from 0.1 to 10 mass %, and most preferably from 0.1 to 5 mass %.

These can be quantitatively determined, for example, from an NMR spectrum of the composition.

Examples of the method for producing the composition having the above-described properties include a method of, at the polymerization of the compound (I), using highly dilute conditions, adding a chain transfer agent, optimizing the reaction solvent, continuously adding the polymerization initiator, continuously adding the compound (I), adding a radical trapping agent, or employing living polymerization.

After the polymerization of the compound (I), for example, a method of removing insoluble matters by filtration or subjecting the reaction solution to purification by column chromatography or purification by reprecipitation treatment may also be employed.

Here, the reprecipitation treatment is to precipitate the composition of the invention by adding a bad solvent (a solvent which does not substantially dissolve the composition of the invention) to the reaction solution after removing, if desired, the reaction solvent by distillation, or by adding dropwise the reaction solution after removing, if desired, the reaction solvent by distillation to a bad solvent, and collect the composition by filtration.

Preferred examples of the bad solvent include alcohols (e.g., methanol, ethanol, isopropyl alcohol) and hydrocarbons (e.g., hexane, heptane). The bad solvent is preferably used in an amount of from equivalent to 200 times by mass, more preferably from 2 to 50 times by mass, based on the composition of the present invention. By performing the reprecipitation treatment, a film having a lower dielectric constant can be formed.

At the time of producing the polymerization product of the compound (I), the reaction solution after performing the polymerization reaction of the compound (I) may directly used but is preferably used after concentrating it by removing the reaction solvent by distillation. Also, a reprecipitation treatment is preferably performed before use.

The concentration is preferably performed by heating the reaction solution and/or reducing the pressure in a rotary evaporator, a distilling apparatus or a reactor in which the polymerization reaction is performed. The temperature of the reaction solution at the concentration is generally from 0 to 180° C., preferably from 10 to 140° C., more preferably from 20 to 100° C., and most preferably 30 to 60° C. The pressure at the concentration is generally from 0.133 Pa to 100 kPa, preferably from 1.33 Pa to 13.3 kPa, more preferably from 1.33 Pa to 1.33 kPa.

In concentrating the reaction solution, the concentration is preferably performed until the solid content in the reaction solution becomes 10 mass % or more, more preferably 30 mass % or more, and most preferably 50 mass % or more.

In the composition of the present invention and the production process thereof, a polymerization inhibitor may be added for suppressing excessive polymerization. Examples of the polymerization inhibitor include 4-methoxyphenol and catechol.

The composition of the present invention in one embodiment contains, separately from the polymerization product of the compound (I), a heat-resistant organic polymer compound having a carbon-carbon unsaturated bond capable of reacting with the polymerization product of the compound (I) at the film formation or the like.

The heat-resistant organic polymer compound is a compound containing a carbon atom and having a weight average molecular weight of 500 to 5,000,000.

Representative examples of the heat-resistant organic polymer compound include an organosiloxane, a polyacrylate, a polymethacrylate, an aminopolyacrylamide, an isobutylene maleic anhydride, an acid amide, AAS (acrylonitrile-acrylate-styrene copolymer), AES (acrylonitrile-ethylene-propylene-styrene copolymer), AS (acrylonitrile-styrene copolymer), ABS (acrylonitrile-butadiene-styrene copolymer), ACS (blend of acrylonitrile-styrene copolymer and chlorinated polyethylene), MBS (methyl methacrylate-butadiene-styrene copolymer), an ethylene-vinyl chloride copolymer, an ethylene-vinyl acetate copolymer, an ethylene vinyl acetate vinyl chloride graft copolymer, an ethylene vinyl alcohol copolymer, a chlorinated polyvinyl chloride, a chlorinated polyethylene, a chlorinated polypropylene, a carboxyvinyl polymer, a ketone resin, a fluorinated plastic, a polytetrafluoroethylene, an ethylene fluoride polypropylene copolymer, PFA (tetrafluoroethylene-perfluoroalkoxy vinyl ether copolymer, a polychlorotrifluoroethylene, an ethylene tetrafluoroethylene copolymer, a polyvinylidene fluoride, a polyvinyl fluoride, a polyacetal, a polyamide, a nylon, a copolymerized polyamide, a polyamideimide, a polyarylate, a polyether imide, a polyether ether ketone, a polyethylene, a polyethylene oxide, a polyethylene terephthalate, a polyvinylidene chloride, a polyvinylidene chloride latex, a polyvinyl chloride polycarbonate, a polyglutamic acid ester, a polyvinyl acetate, a polystyrene, a polysulfone, a polyether sulfone, a polyamine sulfone, a poly-p-vinyl phenol, a poly-p-methylstyrene, a polyallylamine, a polyvinyl alcohol, a polyvinyl acetate, a polyvinyl ether, a polyvinylbutyral, a polyvinylformal, a polyphenylene ether, a polyphenylene sulfide, a polybutadiene, a polybutylene terephthalate, a polypropylene, a polymethylpentene, a polyacetylene, an epoxy resin, an oligoester acrylate, a xylene resin, a guanamine resin, a diallyl phthalate resin, a vinyl ester resin, a phenol resin, an unsaturated polyester resin, a furan resin, a polyimide, a polyurethane, a cellulose, a cellulose acetate, a celluloid, a cellulose fatty acid ester, a cellulose aromatic carboxylic acid ester, a cellulose derivative, a polyoxazoline, a polyvinylpyrrolidone, a polyvinyl acetate, a polyethylene glycol dimethyl ether, a gelatin, a polyarylene, and a polybenzoxazole.

Among these, preferred are an organosiloxane, a polyimide, a polybenzoxazole, a polyarylene and a polyacetylene.

A polymer compound which forms the above-described organic polymer compound through a known reaction is also a preferred example of the organic polymer compound for use in the present invention.

These organic polymer compounds have heat resistance. The heat resistance as used herein means that the weight loss when kept in nitrogen at 300° C. for 1 hour is 10% or less.

This organic polymer compound and its precursor have a carbon-carbon unsaturated bond capable of reacting with the polymerization product of the compound (I) at the film formation or the like.

The carbon-carbon unsaturated bond contained in the organic polymer compound may be introduced after synthesizing the polymer compound or may be previously introduced into a low molecular compound used for forming the organic polymer compound but is preferably previously introduced into a low molecular compound.

In this case, the organic polymer compound may be formed by a reaction of a functional group present in the low molecular compound separately from the carbon-carbon unsaturated bond, or the organic polymer compound may be formed by reacting a part of the carbon-carbon unsaturated bond contained in the low molecular compound.

Examples of this copolymer include a siloxane polymer synthesized by hydrolyzing and condensing an alkoxysilane having a vinyl or ethynyl group as a substituent, a polybenzoxazole synthesized by performing a condensation reaction with use of a vinyl or ethynyl group-containing aromatic dicarboxylic acid and an o-aminophenol derivative, a polyarylene synthesized by a reaction of an aromatic ethynyl group and a cyclopentadienone group, and a polyacetylene synthesized by a reaction of ethynyl groups with each other.

The mixing ratio of the polymerization product of the compound (I) contained in the composition of the present invention to the heat-resistant organic polymer compound and its precursor is, in terms of the weight ratio, preferably from 1:99 to 99:1, more preferably from 5:95 to 95:5, and most preferably from 10:90 to 90:10.

In the present invention, the polymerization product and heat-resistant organic polymer compound for use in the present invention are preferably used by dissolving these in an appropriate solvent and coating the solution on a support. Preferred examples of the solvent which can be used include ethylene dichloride, cyclohexanone, cyclopentanone, 2-heptanone, methyl isobutyl ketone, γ-butyrolactone, methyl ethyl ketone, methanol, ethanol, dimethylimidazolidinone, ethylene glycol monomethyl ether, ethylene glycol monoethyl ether, ethylene glycol dimethyl ether, 2-methoxyethyl acetate, ethylene glycol monoethyl ether acetate, propylene glycol monomethyl ether (PGME), propylene glycol monomethyl ether acetate (PGMEA), tetraethylene glycol dimethyl ether, triethylene glycol monobutyl ether, triethylene glycol monomethyl ether, isopropanol, ethylene carbonate, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethylacetamide, dimethylsulfoxide, N-methylpyrrolidone, tetrahydrofuran, diisopropylbenzene, toluene, xylene and mesitylene. These solvents are used individually or as a mixture.

Among these solvents, preferred are propylene glycol monomethyl ether acetate, propylene glycol monomethyl ether, 2-heptanone, cyclohexanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, butyl acetate, methyl lactate, ethyl lactate, methyl methoxypropionate, ethyl ethoxypropionate, N-methylpyrrolidone, N,N-dimethylformamide, tetrahydrofuran, methyl isobutyl ketone, xylene, mesitylene and diisopropylbenzene.

The total concentration of solid materials in the composition of the present invention is preferably from 1 to 30 mass % and is appropriately adjusted according to the purpose of use. When the total concentration of solid materials in the composition is from 1 to 30 mass %, the thickness of the film coating falls in an appropriate range and higher storage stability of the coating solution is also obtained.

The composition of the present invention may contain a polymerization initiator but preferably does not contain a polymerization initiator because the storage stability of the composition is good.

However, in the case where the composition of the present invention must be film-formed at a low temperature, a polymerization initiator is preferably contained. In this case, examples of the polymerization initiator are the same as those described above. Also, an initiator and a sensitizer, which bring about polymerization by the effect of radiation, may be used for this purpose.

The composition of the present invention preferably has a sufficiently low content of metal as an impurity. The metal concentration in the composition can be measured with high sensitivity by ICP-MS, and the content of metal other than transition metal is preferably 30 ppm or less, more preferably 3 ppm or less, still more preferably 300 ppb or less. Also, the transition metal has a high catalytic function of accelerating oxidation and causes the dielectric constant of the film obtained in the present invention to elevate due to an oxidation reaction in the prebake or thermal curing process. From this viewpoint, the content of the transition metal is preferably lower and is preferably 10 ppm or less, more preferably 1 ppm or less still more preferably 100 ppb or less.

The metal concentration in the composition can also be evaluated by performing a total-reflection fluorescent X-ray measurement on the film obtained using the composition of the present invention. In case of using a W-line as the X-ray source, the metal elements which can be observed are K, Ca, Ti, Cr, Mn, Fe, Co, Ni, Cu, Zn and Pd, and the concentration of each metal element is preferably $100 \times 10^{10}$ $cm^{-2}$ or less, more preferably $50 \times 10^{10}$ $cm^{-2}$ or less, still more preferably $10 \times 10^{10}$ $cm^{-2}$ or less. As for the halogen, Br can be also observed, and the residual amount thereof is preferably $10,000 \times 10^{10}$ $cm^{-2}$ or less, more preferably $1,000 \times 10^{10}$ $cm^{-2}$ or less, still more preferably $400 \times 10^{10}$ $cm^{-2}$ or less. Furthermore, as for the halogen, Cl can be also observed, but this halogen causes a damage to the CVD apparatus, etching apparatus or the like and from this viewpoint, the residual amount thereof is preferably $100 \times 10^{10}$ $cm^{-2}$ or less, more preferably $50 \times 10^{10}$ $cm^{-2}$ or less, still more preferably $10 \times 10^{10}$ $cm^{-2}$ or less.

In the composition of the present invention, additives such as radical generator, surfactant, silane coupling agent and adherence agent may be added within the range not impairing the characteristics (e.g., heat resistance, dielectric constant, mechanical strength, coatability, adhesion) of the obtained insulating film.

In the present invention, any surfactant may be used, but examples thereof include a nonionic surfactant, an anionic surfactant and a cationic surfactant and further include a silicone-containing surfactant, a fluorine-containing surfactant, a polyalkylene oxide-based surfactant, and an acryl-based surfactant. In the present invention, one kind of a surfactant may be used, or two or more kinds of surfactants may be used. The surfactant is preferably a silicone-containing surfactant, a nonionic surfactant, a fluorine-containing surfactant or an acryl-based surfactant, more preferably a silicone-containing surfactant.

The amount added of the surfactant for use in the present invention is preferably from 0.01 to 1 mass %, more preferably from 0.1 to 0.5 mass %, based on the entire amount of the film forming coating solution.

In the present invention, the silicon-containing surfactant means a surfactant containing at least a monoatomic Si atom. The silicone-containing surfactant for use in the present invention may be any silicone-containing surfactant but preferably has a structure containing alkylene oxide and dimethylsiloxane, more preferably a structure containing the following chemical formula:

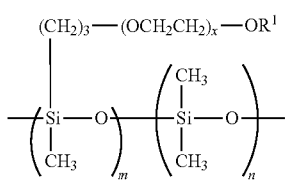

wherein $R^1$ is a hydrogen atom or an alkyl group having a carbon number of 1 to 5, x is an integer of 1 to 20, m and n each is independently an integer of 2 to 100, and the plurality of $R^1$'s may be the same or different.

Examples of the silicon-containing surfactant for use in the present invention include BYK306 and BYK307 (produced by Byk-Chemie); SH7PA, SH21PA, SH28PA and SH30PA (produced by Dow Corning Toray Silicone Co., Ltd.); and Troysol S366 (produced by Troy Chemical Inc.).

The nonionic surfactant for use in the present invention may be any nonionic surfactant. Examples thereof include polyoxyethylene alkyl ethers, polyoxyethylene aryl ethers, polyoxyethylene dialkyl esters, sorbitan fatty acid esters, fatty acid-modified polyoxyethylenes, and a polyoxyethylene-polyoxypropylene block copolymer.

The fluorine-containing surfactant for use in the present invention may be any fluorine-containing surfactant. Examples thereof include perfluorooctyl polyethylene oxide, perfluorodecyl polyethylene oxide and perfluorododecyl polyethylene oxide.

The acryl-based surfactant for use in the present invention may be any acryl-based surfactant. Examples thereof include a (meth)acrylic acid-based copolymer.

In the present invention, any silane coupling agent may be employed, but examples thereof include 3-glycidyloxypropyltrimethoxysilane, 3-aminoglycidyloxy-propyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-trimethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane. In the present invention, one kind of a silane coupling agent may be used, or two or more kinds may be used.

In the present invention, any adhesion promoter may be used, but examples thereof include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl)ethyltrimethoxysilane, trimethoxyvinylsilane, γ-aminopropyltriethoxysilane, aluminum monoethylacetoacetate diisopropylate, vinyltris(2-methoxyethoxy)silane, N-(2-aminoethyl)-3-aminopropylmethyldimethoxysilane, N-(2-aminoethyl)-3-aminopropyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, trimethylchlorosilane, dimethylvinylchlorosilane, methyldiphenylchlorosilane, chloromethyldimethylchlorosilane, trimethylmethoxysilane, dimethyldiethoxysilane, methyldimethoxysilane, dimethylvinylethoxysilane, diphenyldimethoxysilane, phenyltriethoxysilane, hexamethyldisilazane, N,N'-bis(trimethylsilyl)urea, dimethyltrimethylsilylamine, trimethylsilylimidazole, vinyltrichlorosilane, benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine, 1,1-dimethylurea, 1,3-dimethylurea, and a thiourea compound. A functional silane coupling agent is preferred as the adhesion promoter. The amount of the adhesion promoter used is preferably 10 parts by mass or less, more preferably from 0.05 to 5 parts by mass, per 100 parts by mass of the entire solid material.

In the composition of the present invention, for the purpose of making the film porous and thereby reducing the dielectric constant, a pore forming factor may be used within the allowable range in view of mechanical strength of the film.

The pore forming factor in the additive working out to a pore forming agent is not particularly limited, but a nonmetallic compound is suitably used, and the nonmetallic compound needs to satisfy both the solubility in a solvent used in the film-forming coating solution and the compatibility with the polymerization product of the present invention.

As for the pore forming agent, a polymer may also be used. Examples of the polymer which can be used as the pore forming agent include an aromatic polyvinyl compound (e.g., polystyrene, polyvinylpyridine, halogenated aromatic polyvinyl compound), a polyacrylonitrile, a polyalkylene oxide (e.g., polyethylene oxide, polypropylene oxide), a polyethylene, a polylactic acid, a polysiloxane, a polycaprolactone, a polycaprolactam, a polyurethane, a polymethacrylate (e.g., polymethyl methacrylate), a polymethacrylic acid, a polyacrylate (e.g., polymethyl acrylate), a polyacrylic acid, a polydiene (e.g., polybutadiene, polyisoprene), a polyvinyl chloride, a polyacetal, an amine-capped alkylene oxide, a polyphenylene oxide, a poly(dimethylsiloxane), a polytetrahydrofuran, a polycycylohexylethylene, a polyethyloxazoline, a polyvinylpyridine, and a polycaprolactone.

In particular, a polystyrene can be suitably used as the pore forming agent. Examples of the polystyrene include an anionically polymerized polystyrene, a syndiotactic polystyrene, and an unsubstituted or substituted polystyrene (e.g., poly(α-methylstyrene)), with an unsubstituted polystyrene being preferred.

Furthermore, a thermoplastic polymer may also be used as the pore forming agent. Examples of the thermoplastic pore-forming polymer include polyacrylate, polymethacrylate, polybutadiene, polyisoprene, polyphenylene oxide, polypropylene oxide, polyethylene oxide, poly(dimethylsiloxane), polytetrahydrofuran, polyethylene, polycycylohexylethylene, polyethyloxazoline, polycaprolactone, polylactic acid and polyvinylpyridine.

The boiling point or decomposition temperature of the pore forming agent is preferably from 100 to 500° C., more preferably from 200 to 450° C., still more preferably from 250 to 400° C. The molecular weight thereof is preferably from 200 to 50,000, more preferably from 300 to 10,000, still more preferably from 400 to 5,000.

The amount of the pore forming agent added is, in mass %, preferably from 0.5 to 75%, more preferably from 0.5 to 30%, still more preferably from 1 to 20%, based on the polymerization product forming the film.

The polymerization product may contain a decomposable group as the pore forming factor, and the decomposition temperature thereof is preferably from 100 to 500° C., more preferably from 200 to 450° C., still more preferably from 250 to 400° C. The content of the decomposable group is, in mol %, preferably from 0.5 to 75%, more preferably from 0.5 to 30%, still more preferably from 1 to 20%, based on the polymer forming the film.

The film forming composition of the present invention is preferably used for the film formation after eliminating insoluble matters, gel-like components and the like by filtration through a filter. The pore size of the filter used here is preferably from 0.001 to 0.2 μm, more preferably from 0.005 to 0.05 μm, and most preferably from 0.005 to 0.03 μm. The material for the filter is preferably PTFE, polyethylene or nylon, more preferably polyethylene or nylon.

The film obtained using the film forming composition of the present invention can be formed by coating the film forming composition on a substrate such as silicon wafer, $SiO_2$ wafer, SiN wafer, glass or plastic film by an arbitrary method such as spin coating, roller coating, dip coating, scan coating, spray coating or bar coating, and, if desired, removing the solvent by a heat treatment. The coating method on the substrate is preferably spin coating or scan coating, more preferably spin coating.

For the spin coating, a commercially available apparatus can be used. Preferred examples thereof include Clean Track Series (manufactured by Tokyo Electron Ltd.), D-Spin Series (manufactured by Dainippon Screen Mfg. Co., Ltd.), and SS or CS Series (manufactured by Tokyo Ohka Kogyo Co., Ltd.). As for the spin coating conditions, any rotation speed may be employed, but in view of in-plane uniformity of the film, a rotation speed of about 1,300 rpm is preferred for a 300-mm silicon substrate. Also, the method for dispensing the composition solution may be a dynamic dispense of dispensing the composition solution onto a rotating substrate, or a static dispense of dispensing the composition solution onto a stopped substrate, but in view of in-plane uniformity of the film, the dynamic dispense is preferred. Also, in the light of suppressing the consumption of the composition, a method of preliminarily dispensing only the main solvent of the composition onto a substrate to form a liquid film, and dispensing the composition thereon may be used. The spin coating time is not particularly limited but in view of the throughput, is preferably 180 seconds or less. Furthermore, in view of conveyance of the substrate, a treatment (edge rinse, back rinse) for not leaving the film on the edge part of the substrate is also preferably performed. The method for the heat treatment is not particularly limited, and a method usually employed may be applied, such as hot plate heating, heating using a furnace, and light-irradiation heating using a xenon lamp in RTP (rapid thermal processor) or the like. A method by hot plate heating, and a heating method using a furnace are preferred. As for the hot plate, a commercially available apparatus can be preferably used, and preferred examples thereof include Clean Track Series (manufactured by Tokyo Electron Ltd.), D-Spin Series (manufactured by Dainippon Screen Mfg. Co., Ltd.), and SS or CS Series (manufactured by Tokyo Ohka Kogyo Co., Ltd.). As regards the furnace, for example, α Series (manufacture by Tokyo Electron Ltd.) may be preferably used.

The polymerization product of the present invention is preferably cured after coating on a substrate. The term "curing" means to cure the composition on the substrate and impart solvent resistance to the film. As for the curing method, a heat treatment (firing) is particularly preferred. For example, a polymerization reaction of the vinyl group remaining in the polymerization product, which is proceeding during post-heating, may be utilized. The conditions for the post-heating treatment are preferably from 100 to 450° C., more preferably from 200 to 420° C., still more preferably from 350 to 400° C., and preferably from 1 minute to 2 hours, more preferably from 10 minutes to 1.5 hours, still more preferably from 30 minutes to 1 hour. The post-heating treatment may be performed in several parts. In particular, the post-heating is preferably performed in a nitrogen atmosphere so as to prevent thermal oxidation by oxygen.

In the present invention, the curing may also be performed, instead of a heat treatment, by irradiating a high-energy ray, thereby causing a polymerization reaction of the vinyl or ethynyl group remaining in the polymerization product. Examples of the high-energy ray include an electron beam, an ultraviolet ray and an X-ray, but the present invention is not limited to these methods.

As for the high-energy ray, in the case of using an electron beam, the energy is preferably from 0 to 50 keV, more preferably from 0 to 30 keV, still more preferably from 0 to 20 keV. The total dose of the electron beam is preferably from 0 to 5 μC/cm$^2$, more preferably from 0 to 2 μC/cm$^2$, still more preferably from 0 to 1 μC/cm$^2$. At the irradiation with an electron beam, the substrate temperature is preferably from 0 to 450° C., more preferably from 0 to 400° C., still more preferably from 0 to 350° C. The pressure is preferably from 0 to 133 kPa, more preferably from 0 to 60 kPa, still more preferably from 0 to 20 kPa. From the standpoint of preventing oxidation of the polymerization product of the present invention, the atmosphere in the periphery of the substrate is preferably an inert atmosphere such as Ar, He and nitrogen. Also, a gas such as oxygen, hydrocarbon and ammonia may be added for the purpose of generating a plasma, an electromagnetic wave or a reaction with chemical species by an interaction with the electron beam. In the present invention, the irradiation with an electron beam may be performed a plurality of times, and the conditions for the electron beam irradiation need not be the same each time but may be different every time.

An ultraviolet ray may also be used as the high-energy ray. In using an ultraviolet ray, the irradiation wavelength region is preferably from 190 to 400 nm, and the output thereof directly above the substrate is preferably from 0.1 to 2,000 mWcm$^{-2}$. At the ultraviolet irradiation, the substrate temperature is preferably from 250 to 450° C., more preferably from 250 to 400° C., still more preferably from 250 to 350° C. From the standpoint of preventing oxidation of the polymerization product of the present invention, the atmosphere in the periphery of the substrate is preferably an inert atmosphere such as Ar, He and nitrogen. In this case, the pressure is preferably from 0 to 133 kPa.

The film may also be cured by performing the heat treatment and the high-energy ray irradiation at the same time or in succession.

As for the film thickness in forming an insulating film, the film coating may be formed to a thickness, in terms of dry thickness, of approximately from 0.05 to 1.5 μm by one coating operation and to a thickness of approximately from 0.1 to 3 μm by two coating operations.

In order to cause no decomposition of the cage structure at the firing, it is preferred that a nucleophilic attacking group against Si atom (such as hydroxyl group or silanol group) is substantially not present during the production of the composition and insulating film.

More specifically, the composition of the present invention is coated on a substrate (usually a substrate having thereon metal wiring), for example, by spin coating, the solvent is dried by performing a preliminary heat treatment, and a final heat treatment (annealing) is then performed at a temperature of 300 to 430° C., whereby an insulating film having a low dielectric constant can be formed.

In the case where the film obtained using the film forming composition of the present invention is used as an interlayer insulating film for semiconductors, the wiring structure may have, on a lateral surface of the wiring, a barrier layer for preventing metal migration, or may have a capping layer or interlayer adhesion layer for preventing separation at CMP or other layers such as etching stopper layer, on the top or bottom surface of the wiring or interlayer insulating film. Furthermore, the interlayer insulating film may be divided, if desired, into a plurality of layers composed of different materials.

The insulating film of the present invention may be used by forming a stack structure with another Si-containing insulating film or an organic film. The insulating film is preferably used by stacking it with a hydrocarbon-based film.

The film obtained using the film forming composition of the present invention may be subjected to etching for forming copper wiring or for other purposes. The etching may be either wet etching or dry etching, but dry etching is preferred. In the drying etching, either ammonia-based plasma or fluorocarbon-based plasma may be appropriately used. For such plasma, not only Ar but also a gas such as oxygen, nitrogen, hydrogen or helium can be used. After the etching process, ashing may also be performed for the purpose of removing a photoresist or the like used in the process, and the film may be further washed to remove the ashing residue.

The film obtained using the film forming composition of the present invention may be subjected, after the copper wiring process, to CMP (chemical-mechanical polishing) for planarizing the copper plated part. As for the CMP slurry (chemical liquid), a commercially available slurry (for example, produced by Fujimi, Rodel Nitta Co., JSR Corp., or Hitachi Chemical Co., Ltd.) may be appropriately used. Also, as for the CMP apparatus, a commercially available apparatus (for example, manufactured by Applied Materials Inc., or Ebara Corp.) may be appropriately used. The film may be further washed for removing the slurry residue after the CMP process.

The film obtained using the film forming composition of the present invention may be utilized for various purposes. For example, the film is suitable as an insulating film in a semiconductor device such as LSI, system LSI, DRAM, SDRAM, RDRAM and D-RDRAM, or in an electronic component such as multi-chip module and multilayer wiring board, and is also usable as an interlayer insulating film, etching stopper film, surface protective film or buffer coat film for a semiconductor, as a passivation film or α-ray intercepting film in LSI, as a cover film or overcoat film of a flexographic printing plate, as a cover coat of a flexible coppered plate, as a solder resist film, and as a liquid crystal orientation film. Furthermore, the film may also be used as a surface protective film, antireflective film or phase difference film for optical devices.

By virtue of this method, an insulating film assured of a low dielectric constant, that is, an insulating film having a relative dielectric constant of 2.7 or less, preferably 2.5 or less, can be obtained.

EXAMPLES

The present invention is described in greater detail below by referring to Examples, but the scope of the present invention is of course not limited thereto.

Synthesis Example 1

Compound (I-d) (1 g) was added to 55 g of butyl acetate, and the mixture was refluxed under heating in a nitrogen stream. Thereto, 8 µl in total of Luperox 11 produced by ARKEMA Yoshitomi, Ltd. was added as a polymerization initiator in 2 µl portions every 2 hours, and the mixture was further refluxed under heating for 4 hours and after cooling to room temperature, concentrated under reduced pressure to a liquid weight of 1.5 g. Subsequently, 20 ml of methanol was added and after stirring for 1 hour, the solid matter was collected by filtration and dried to obtain 0.80 g of (A-1) a solid material. The solid material was analyzed by GPC and found to have Mw=208,000 and Mn=39,000. In the solid material, the content of unreacted Compound (I-d) was 1 mass % or less. Also, in the solid material, components having a molecular weight of 2,000,000 or more were substantially not contained. Incidentally, in GPC, using Waters 2695 and Shodex GPC column KF-805L, tetrahydrofuran was passed as an elution solvent at a column temperature of 40° C. and a flow rate of 1 ml/min, and 50 µl of a tetrahydrofuran solution having a sample concentration of 0.5 mass % was injected. A calibration curve for the monomer was prepared from the integrated value of an RI detecting apparatus (Waters 2414), and the monomer in the solid material was quantitatively determined. The Mn and Mw were calculated with use of the calibration curve prepared using standard polystyrene.

When the $^1$H-NMR of the solid material was measured using deuterated chloroform as the measuring solvent, a proton peak derived from an alkyl group formed by the polymerization of a vinyl group and a proton peak derived from the remaining vinyl group were observed at an integration ratio of 43:57, revealing that the vinyl groups were polymerized with each other. It is apparent that 60 mass % or more of the reactant of Compound (I) is contained in (A-1).

A polyphenylene polymer (Polymer 1) synthesized from equimolar amounts of 3,3'-(oxydi-1,4-phenylene)bis(2,4,5-triphenylcyclopentadienone) and 1,3,5-tris(phenylethynyl)-benzene according to Example 5 of JP-T-2002-534546 (the term "JP-T" as used herein means a "published Japanese translation of a PCT patent application") was obtained. This polymer was analyzed by GPC and found to have Mw=18, 100. From H-NMR and IR spectrum, it was confirmed that an unreacted ethynyl group capable of reacting with the solid material (A-1) at the film formation was contained in Polymer 1.

A-1 (0.2 g) was added to 20 g of a Polymer 1-containing solution (containing 1 g of solid materials) to produce Composition (B-1).

Synthesis Example 2

Tetravinylsilane (500 mg) was added to 11 ml of butyl acetate and while refluxing the mixture under heating in a nitrogen stream, Luperox 11 produced by ARKEMA Yoshitomi, Ltd. was added 5 times in total in 5 µl portions every 1 hour. The mixture was further refluxed under heating for 1 hour and after cooling to room temperature, concentrated under reduced pressure. Subsequently, 20 ml of methanol was added and after stirring for 1 hour, the solid matter was collected by filtration and dried to obtain 200 mg of (Polymer 2) as a solid material. The solid material was analyzed by GPC and found to have Mw=19,100. From H-NMR and IR spectrum, it was confirmed that an unreacted ethynyl group capable of reacting with the solid material (A-1) at the film formation was contained in Polymer 2. (Polymer 2) (100 mg)

and 100 mg of (A-1) were dissolved in 4 ml of cyclohexanone to produce Composition (B-2).

Synthesis Example 3

1,3-Diethyladamantane (20 g) and 100 ml of 1,3,5-triisopropylbenzene were charged into a flask and stirred under heating at an internal temperature of 200° C. for 30 hours in a nitrogen stream and after cooling to room temperature, insoluble matters in the reaction solution were removed by filtration. Isopropyl alcohol was added to the obtained filtrate, and the solid precipitated was collected by filtration. Furthermore, the obtained solid was suspended in isopropyl alcohol and after stirring, the suspension was again filtered to obtain 7 g of (Polymer 3) as a yellow polymerization product. As a result of GPC measurement, the mass average molecular weight was 31,000. From H-NMR and IR spectrum, it was confirmed that an unreacted ethynyl group capable of reacting with the solid material (A-1) at the film formation was contained in Polymer 3. (Polymer-3) (200 mg) and 100 mg of (A-1) were dissolved in 6 ml of cyclohexanone to produce Composition (B-3).

Synthesis Example 4

Compound (d-1) (0.2 g) was added to 20 g of a Polymer 1-containing solution (containing 1 g of solid materials) to produce Comparative Composition (B-4).

Examples 1 to 3 and Comparative Examples 1 to 4

A 5 mass % cyclohexanone solution of each of Coating Solutions (B-1) to (B-4) and (Polymer 1) to (Polymer 3) produced in Synthesis Examples was filtered through a Teflon (registered trademark)-made filter having a pore size of 0.2 µm and after coating the obtained solution on a 4-inch silicon wafer by spin coating, the substrate was dried on a hot plate at 130° C. for 1 minute and then at 230° C. for 1 minute and further heated in a clean oven in a nitrogen atmosphere at 400° C. for 30 minutes to produce Film Coatings (C-1) to (C-7).

The dielectric constant was measured using a mercury probe manufactured by Four Dimensions Inc. (measuring temperature: 25° C.). The evaluation results are shown in Table 1.

TABLE 1

|  | Film Coating | Coating Solution Used | Dielectric Constant of Film Coating |
| --- | --- | --- | --- |
| Example 1 | C-1 | B-1 | 2.49 |
| Example 2 | C-2 | B-2 | 2.42 |
| Example 3 | C-3 | B-3 | 2.42 |
| Comparative Example 1 | C-4 | B-4 | 2.72 |
| Comparative Example 2 | C-5 | Polymer 1 solution | 2.78 |
| Comparative Example 3 | C-6 | polymer 2 solution | 2.54 |
| Comparative Example 4 | C-7 | polymer 3 solution | 2.53 |

It is seen from the results in Table 1 that when the composition of the present invention is used, a film having a low dielectric constant can be formed.

Synthesis Example 5

Compound (I-d) (1 g) and 0.5 g of Compound (D-I-a) were added to 60 g of butyl acetate, and the mixture was refluxed under heating in a nitrogen stream. Thereto, 55 µl of Luperox 11 produced by ARKEMA Yoshitomi, Ltd. was added as a polymerization initiator, and the mixture was further refluxed under heating for 4 hours (concentration at polymerization: 2.4 mass %) and after cooling to room temperature, concentrated under reduced pressure to a liquid weight of 8 g. Subsequently, 20 ml of methanol was added and after stirring for 1 hour, the solid matter was collected by filtration and dried to obtain 0.70 g of a solid material. The solid material was analyzed by GPC and found to have Mw=81,000 and Mn=13,000. In the solid material, the total content of unreacted Compound (I-d) and unreacted Compound (D-I-a) was 1.5 mass %. Also, in the solid material, components having a molecular weight of 2,000,000 or more were substantially not contained. The obtained solid material was dissolved in 8 ml of cyclohexane to obtain Composition (1) of the present invention.

Synthesis Example 6

Compound (I-d) (1 g) and 0.2 g of Compound (D-IV-b) were added to 50 g of butyl acetate, and the mixture was refluxed under heating in a nitrogen stream. Thereto, 50 µl of Luperox 11 produced by ARKEMA Yoshitomi, Ltd. was added as a polymerization initiator, and the mixture was further refluxed under heating for 4 hours (concentration at polymerization: 2.3 mass %) and after cooling to room temperature, concentrated under reduced pressure to a liquid weight of 8 g. Subsequently, 20 ml of methanol was added and after stirring for 1 hour, the solid matter was collected by filtration and dried to obtain 0.72 g of a solid material. The solid material was analyzed by GPC and found to have Mw=209,000 and Mn=38,000. In the solid material, the total content of unreacted Compound (I-d) and unreacted Compound (D-IV-b) was 1.5 mass %. Also, in the solid material, components having a molecular weight of 2,000,000 or more were substantially not contained. The obtained solid material was dissolved in 9 ml of cyclohexane to obtain Composition (2) of the present invention.

Synthesis Example 7

Compound (I-d) (1 g) and 0.4 g of Compound (D-II-b) were added to 50 g of butyl acetate, and the mixture was refluxed under heating in a nitrogen stream. Thereto, 55 µl of Luperox 11 produced by ARKEMA Yoshitomi, Ltd. was added as a polymerization initiator, and the mixture was further refluxed under heating for 4 hours (concentration at polymerization: 2.7 mass %) and after cooling to room temperature, concentrated under reduced pressure to a liquid weight of 8 g. Subsequently, 20 ml of methanol was added and after stirring for 1 hour, the solid matter was collected by filtration and dried to obtain 0.69 g of a solid material. The solid material was analyzed by GPC and found to have Mw=181,000 and Mn=23,000. In the solid material, the total content of unreacted Compound (I-d) and unreacted Compound (D-II-b) was 1.5 mass %. Also, in the solid material, components having a molecular weight of 2,000,000 or more were substantially not contained.

The obtained solid material was dissolved in 8 ml of propylene glycol monomethyl ether acetate to obtain Composition (3) of the present invention.

Synthesis Example 8

In a 300 ml-volume Kjeldahl flask, 84.5 g of vinyltriethoxysilane and 145.2 g of propylene glycol monomethyl ether were charged, and 21.8 ml of an aqueous 0.4 mass % nitric acid solution was added. The mixture was stirred at room temperature for 5 hours to obtain a comparative composition.

The compositions produced in Synthesis Examples 5 to 8 each was filtered through a Teflon (registered trademark)-made filter having a pore size of 0.2 μm to prepare a film forming composition. The obtained film forming composition was coated on a 4-inch silicon wafer by spin coating to have a film coating thickness of 500 to 600 nm, dried on a hot plate at 130° C. for 1 minute and then at 190° C. for 1 minute, and further heated in a clean oven in a nitrogen atmosphere at 400° C. for 60 minutes to produce a film coating.

The dielectric constant was measured using a mercury probe manufactured by Four Dimensions Inc. (measuring temperature: 25° C.).

Also, the Young's modulus was measured by Nanoindenter SA2 manufactured by MTS Inc.

The evaluation results are shown in Table 2.

TABLE 2

| Composition | Relative Dielectric Constant | Young's Modulus (GPa) |
| --- | --- | --- |
| Composition (1) | 2.35 | 8.0 |
| Composition (2) | 2.39 | 8.1 |
| Composition (3) | 2.35 | 6.3 |
| Comparative Composition | 2.91 | 6.3 |

It is seen from the results in Table 2 that when the composition of the present invention is used, a film having a low dielectric constant and a high Young's modulus can be formed.

According to the present invention, an insulating film forming composition and a production method of an insulating film, ensuring that a film suitable for use as an interlayer insulating material in a semiconductor device or the like and assured of excellent film characteristics such as dielectric constant and Young's modulus is formed, can be provided.

The entire disclosure of each and every foreign patent application from which the benefit of foreign priority has been claimed in the present application is incorporated herein by reference, as if fully set forth.

What is claimed is:

1. An insulating film forming composition, comprising:
    a polymer compound obtained by polymerizing a cage-type silsesquioxane compound having two or more vinyl groups or ethynyl groups as substituents;
    a heat-resistant organic polymer compound having a carbon-carbon unsaturated bond; and
    an organic solvent
    wherein in the polymer compound, the vinyl groups or ethynyl groups of the cage-type silsesquioxane compound remain unreacted at a rate of 10 to 99 mol %.

2. The insulating film forming composition according to claim 1,
    wherein the heat-resistant organic polymer compound is an organosiloxane, a polyimide, a polybenzoxazole, a polyarylene or a polyacetylene.

3. The insulating film forming composition according to claim 1,
    wherein the cage-type silsesquioxane compound is a compound having m units of $RSi(O_{0.5})_3$,
    wherein m represents an integer of 8 to 16;
    each R independently represents a non-hydrolyzable group; and
    at least two R's are vinyl groups or ethynyl groups, and
    wherein each unit is connected with another unit to form a cage structure while sharing an oxygen atom in each unit.

4. The insulating film forming composition according to claim 3,
    wherein m represents an integer of 8, 10 or 12.

5. A method for producing an insulating film, comprising:
    coating the insulating film forming composition according to claim 1 on a substrate; and then
    curing the coating.

6. The insulating film forming composition according to claim 1,
    wherein the cage-type silsesquioxane compound is compound (I-d) below:

(I-d)

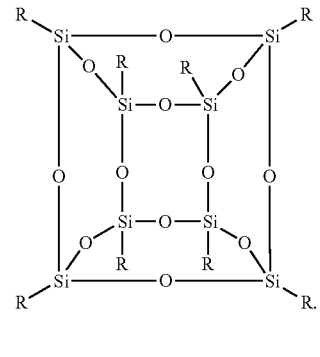

7. The insulating film forming composition according to claim 1,
    wherein the heat-resistant organic polymer compound is a polymer selected from the group consisting of the following (A) to (C):
    (A) a polymer synthesized from 3,3'-(oxydi-1,4-phenylene)bis(2,4,5-triphenylcyclopentadienone) and 1,3,5-tris(phenylethynyl)-benzene;
    (B) a polymer synthesized from tetravinylsilane; and
    (C) a polymer synthesized from 1,3-diethyladamantane and 1,3,5-triisopropylbenzene.

* * * * *